(12) United States Patent
Raley et al.

(10) Patent No.: US 10,854,453 B2
(45) Date of Patent: Dec. 1, 2020

(54) METHOD FOR REDUCING REACTIVE ION ETCH LAG IN LOW K DIELECTRIC ETCHING

(71) Applicant: Tokyo Electron Limited, Minato-ku, Tokyo (JP)

(72) Inventors: Angelique D. Raley, Halfmoon, NY (US); Christopher Cole, West Charlton, NY (US); Andrew W. Metz, Watervliet, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/005,614

(22) Filed: Jun. 11, 2018

(65) Prior Publication Data

US 2018/0358227 A1 Dec. 13, 2018

Related U.S. Application Data

(60) Provisional application No. 62/518,373, filed on Jun. 12, 2017, provisional application No. 62/570,402, filed on Oct. 10, 2017.

(51) Int. Cl.
| | | |
|---|---|---|
| *H01L 21/033* | (2006.01) | |
| *H01L 21/311* | (2006.01) | |
| *H01L 21/02* | (2006.01) | |

(52) U.S. Cl.
CPC .... *H01L 21/0338* (2013.01); *H01L 21/02118* (2013.01); *H01L 21/0337* (2013.01);
(Continued)

(58) Field of Classification Search
CPC ........... H01L 21/0338; H01L 21/02118; H01L 21/0337; H01L 21/31116; H01L 21/31138;
(Continued)

(56) References Cited

U.S. PATENT DOCUMENTS 7,307,025 B1 * 12/2007 Worsham .......... H01L 21/31116
257/E21.252
9,754,798 B1 * 9/2017 Bi ....................... H01L 29/0649
(Continued)

OTHER PUBLICATIONS

International search report for PCT/US2018/036971 dated Oct. 12, 2018, 5 pages.

*Primary Examiner* — Shahed Ahmed
(74) *Attorney, Agent, or Firm* — Rothwell, Figg, Ernst & Manbeck P.C.

(57) ABSTRACT

A substrate processing technique is described herein for etching layers, such as dielectric layers, and more particularly low k dielectric layers in a manner that minimizes etch lag effects. Multiple etch processes are utilized. A first etch process may exhibit etch lag. A second etch process is a multi-step process that may include a deposition sub-step, a purge sub-step and an etch sub-step. The second etch process may exhibit inverse etch lag. The second etch process may be a cyclic process which performs the deposition, purge and etch sub-steps a plurality of times. The second etch process may be an atomic layer etch based process, and more particularly a quasi-atomic layer etch. The combination of the first etch process and the second etch process may provide the desired net effect for the overall etch lag when etching the dielectric layer.

12 Claims, 4 Drawing Sheets

(52) U.S. Cl.
CPC .. *H01L 21/31116* (2013.01); *H01L 21/31138* (2013.01); *H01L 21/31144* (2013.01)

(58) Field of Classification Search
CPC ......... H01L 21/31144; H01L 21/31055; H01L 21/3065–21/30655; H01L 21/32136–32137
See application file for complete search history.

(56) References Cited

U.S. PATENT DOCUMENTS

| | | |
|---|---|---|
| 2009/0081873 A1 | 3/2009 | Park et al. |
| 2010/0243605 A1 | 9/2010 | Nishizuka |
| 2011/0244687 A1 | 10/2011 | Oohara et al. |
| 2013/0023124 A1 | 1/2013 | Nemani et al. |
| 2013/0119018 A1* | 5/2013 | Kanarik .................. H05H 1/46 216/67 |
| 2013/0119019 A1* | 5/2013 | Kanarik ............ H01J 37/32082 216/67 |
| 2015/0017809 A1* | 1/2015 | Bhowmick ....... H01L 21/31116 438/712 |
| 2015/0064919 A1 | 3/2015 | Kim et al. |

* cited by examiner

METHOD FOR REDUCING REACTIVE ION ETCH LAG IN LOW K DIELECTRIC ETCHING

CROSS REFERENCE TO RELATED APPLICATIONS

This application is related to and claims priority to U.S. Provisional Patent Application Ser. No. 62/518,373, filed on Jun. 12, 2017 and U.S. Provisional Patent Application Ser. No. 62/570,402, filed on Oct. 10, 2017, the entire contents of which are herein incorporated by reference.

BACKGROUND

The present disclosure relates to the processing of substrates, such as for example, semiconductor substrates. In particular, it provides a novel method to minimize reactive ion etch (RIE) lag when etching dielectric films of substrates.

As geometries in substrate processing continue to shrink, the technical challenges to forming structures on substrates increase. One such challenge is RIE lag. FIG. 1 illustrates a typical RIE lag effect. As shown in FIG. 1, a substrate 105 is provided with a dielectric layer 110 and a mask layer 115. Though not shown, the substrate and layers of FIG. 1 may be formed from one or more known layers and is not limited to that shown in the figure. The mask layer 115 may be a photoresist layer, a hard mask layer or any other photolithography layer or combination of layers used for an etching process. Also, any layer in a substrate processing process may be subject to an RIE lag effect, and the use of a dielectric layer such as dielectric layer 110 is merely illustrative. The substrate 105 may be comprised of many layers formed during substrate processing, such as those found at a Back End of Line (BEOL) process step or a Front End of Line (FEOL) process step. As shown, patterns of differing geometries have been formed in the mask layer 115 and used as a mask during an etch of dielectric layer 110. The RIE lag effect is shown in that the depth of the dielectric etched in smaller geometry mask opening regions 120 is less than the depth of dielectric etched in the larger geometry opening regions 125. Thus, for structures that have a smaller critical dimension (CD) a RIE lag may occur. RIE lag effect, also known as loading or aspect ratio dependent etching (ARDE), is well known in the art. It will be recognized that the structure of FIG. 1 is merely illustrative to demonstrate known RIE lag effects and the disclosure provided herein is not limited to such a structure.

A variety of techniques have been utilized to lessen RIE lag in a plasma etch process. Various process chamber conditions can be adjusted to attempt to lessen RIE lag, such as pressure, power (continuous verse pulsing), gas flows, etc. Further, atomic layer etch (ALE) plasma techniques have been suggested to improved RIE lag.

It would be desirable to provide a substrate processing technique which minimizes RIE lag.

SUMMARY

Described herein is an innovative method to process substrates via an etching process. The substrate processing techniques described herein provide for etching layers, such as dielectric layers, and more particularly low k dielectric layers, in a manner that minimizes etch lag effects. More particularly, multiple etch processes are utilized. A first etch process may exhibit etch lag. A second etch process is a multi-step process that may include a deposition sub-step, a purge sub-step and an etch sub-step. The second etch process may exhibit inverse etch lag. The second etch process may be a cyclic process which performs the deposition, purge and etch sub-steps a plurality of times. The second etch process may be an atomic layer etch based process, and more particularly a quasi-atomic layer etch. The combination of using both the first etch process and the second etch process to etch the dielectric layer may provide the desired net effect for the overall etch lag when etching the dielectric layer.

In one embodiment, a method for processing a substrate is provided. The method may comprise providing the substrate with a patterned first layer and providing a second layer underling the first layer. The method may further comprise etching a first portion of the second layer with a non-atomic layer etch process while utilizing the patterned first layer as a mask. The method may further comprise etching a second portion of the second layer with an atomic layer etch based process while utilizing the patterned first layer as the mask, the atomic layer etch based process comprising a cyclic process comprising at least a deposition process sub-step and an etch process sub-step. The method may further comprise controlling both the non-atomic layer etch process and the atomic layer etch based process so that the second layer is etched to achieve a desired etch lag effect.

In another embodiment, a method for processing a substrate is provided. The method may comprise providing the substrate with a patterned first layer, and providing a second layer between the first layer and the substrate. The method further comprises etching the second layer with a two-step etch, the two-step etch having a first etch step and a second etch step. The first etch step comprises a continuous wave plasma etch, the continuous wave plasma etch exhibiting etch lag. The second etch step comprises a cyclic process comprising a deposition sub-step, a purge sub-step, and an etch sub-step. The two-step etch is controlled so that so that the second layer is etched in a manner that achieves a desired etch lag effect.

In yet another embodiment, a method for processing an ultra-low K dielectric layer in a reactive ion etch is provided. The method comprises providing, in a process chamber, a substrate having an input patterned structure and the ultra-low k dielectric layer underlying the input patterned structure. The method further comprises performing a first etch process using the input patterned structure as a pattern to etch the ultra-low k dielectric layer. The method further comprises performing a second etch process using the input patterned structure as a pattern to etch the ultra-low k dielectric layer. The second etch process comprising a cyclic etch process that comprises performing a deposition process, performing a purging process, the purging process allowing deposition gases to exit the process chamber, and performing an etch plasma process. A pitch of the input patterned structure is 48 nm or lower and together the first etch process and the second etch process achieve a desired etch lag performance.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
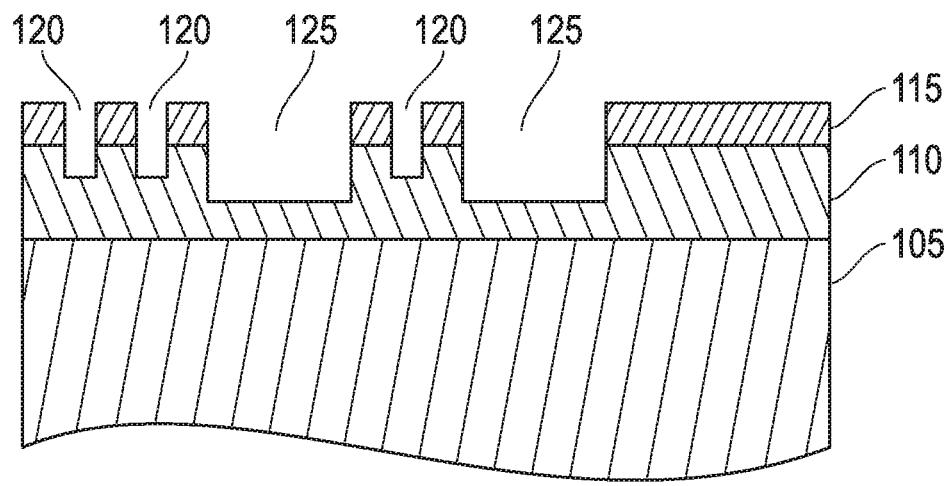
FIG. 1 illustrates an exemplary prior art structure that demonstrates the effects of RIE lag.

It has been found that RIE lag is particularly problematic as critical dimension pitches become smaller. For example, as the pitch of structures falls below 60 nm, and more particularly 48 nm, the RIE lag can become particularly problematic. For example, it has been found that when etching dielectrics, particular low dielectric constant dielectrics, RIE lag effects may increase. Low dielectric constant dielectrics ("low k dielectrics") are well known in the substrate processing art and have a dielectric constant smaller than that of standard silicon dioxide. Thus, for example, it has been found that when forming small CD trenches in low k dielectrics RIE lag may significantly impact the formation of the trenches. In one embodiment, it has been found that as the trench CD drops below about 32 nm, the RIE lag effect reaches a "cliff," and thus becomes even more pronounced and worsens as the CD is made smaller. Exemplary amounts of RIE lag for such geometries may be 20 nm or more in depth. The RIE lag effect is particularly problematic for the formation of trenches in low k dielectrics at BEOL process steps, such as during damascene and dual damascene process steps. As used herein, low k dielectrics generally have a dielectric constant less than about 3.9. Ultra-low k dielectrics generally have a dielectric constant equal to or less than about 2.7.

Traditional techniques for etching low k dielectrics involve the use of continuous wave (CW) plasma etch techniques for extended times. Such techniques, though, exhibit the RIE lag effects discussed above, particularly as CDs enter the range of 32 nm or less. One advantage of CW plasma etching is the relative high etch low k dielectric etch rates that may be achieved using a CW plasma etch. For BEOL processing, such as in damascene and dual damascene process steps, the thickness of the low k dielectric layers may be relatively thick. Thus, the etch rates of CW plasma etching may be desirable to provide a suitable process time for the substrate processing step. As the CDs continue to decrease, however, the RIE lag becomes more problematic.

The disadvantages of a CW plasma etch process for small CD structures may be overcome through the use of an ALE based process. ALE processes are general known to involve processes which remove thin layers sequentially through one or more self-limiting reactions. Such processes often include a cyclic series of deposition and etch steps. The deposition process may modify the exposed surfaces and the etch step may remove the modified layer. Thus, a series of self-limiting reactions may occur. As used herein, an "ALE based" process may include quasi-ALE processes. In such processes, a series of deposition and etch cycles are still used, however, the removal step may not be purely self-limiting as after removal of the modified layer, the etch substantially slows down, though it may not completely stop. In either case, the ALE based processes include a cyclic series of deposition and etch sub-steps. In some embodiments, such sub-steps include an intervening purge sub-step. Note, the etch sub-step of the ALE process may involve a process that utilizes a CW RF power mode or alternatively uses a pulsed RF power mode. In this regard, as known in the art an ALE based process does not exclude the use of a CW RF power mode during the etch sub-step of the cyclic processing.

Figure 2:
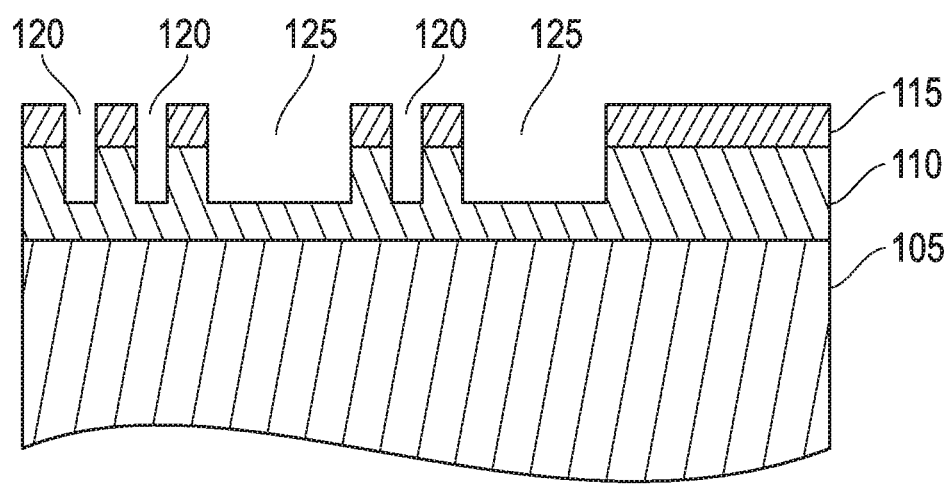
FIG. 2 illustrates an exemplary structure formed using the techniques disclosed herein so that RIE lag is minimized.

As disclosed herein, ALE based process may be utilized to provide a dielectric etch which substantially reduces RIE lag. In one example, the ALE based process is a quasi-ALE plasma process. In one example, the quasi-ALE process may be utilized to provide an etch result such as shown in FIG. 2. As shown in FIG. 2, a mask layer 115 may be provided. In one exemplary embodiment, the mask layer 115 may be a titanium nitride (TiN) layer. As known in the art, other materials and/or a combination of materials and layers may form the mask layer. In the exemplary mask layer provided, the TiN layer thickness may be in the range of 15 nm to 35 nm. In the example provided, the dielectric layer 110 may be a low k dielectric. The dielectric may be formed in any of a variety of manners, including spin on and deposition techniques. In one embodiment, the dielectric layer 110 is a low k dielectric having a dielectric constant less than about 3 and more preferable less than 2.4. In one example, the ultra-low k dielectric is used as the dielectric of a BEOL process step and used as part of the formation of a damascene or dual damascene interconnect structure. In one example, the dielectric layer 110 may have a thickness of about 45 nm to 120 nm and more preferable 40 nm to 80 nm. Through the use of an ALE based process, RIE lag may be minimized. In the exemplary embodiment, for example, the RIE lag between trench CDs of about 15 nm and about 80 nm may be reduced to less than 2 nm RIE lag. Utilizing traditional plasma etch techniques, similar structures may see an RIE lag of between about 13 nm to 20 nm depending upon process conditions.

Substrate 105 may underlie the dielectric layer 110. Though described for exemplary purposes herein as a dielectric layer, it will be recognized that layer to be etched may be any of a wide variety of substrate processing layers. Thus, the layer to be etched may be any substrate layer for which patterning is desired, such as for example, but not limited to dielectric layers or conductive layers. Substrate 105 may be any substrate for which the use of patterned features is desirable. For example, in one embodiment, substrate 105 may be a semiconductor substrate having one or more semiconductor processing layers formed thereon. In one embodiment, the substrate 105 may be a substrate that has been subject to multiple semiconductor processing steps which yield a wide variety of structures and layers, all of which are known in the substrate processing art and may be considered to be part of the substrate 105. In one embodiment, the concepts disclosed herein may be utilized at a BEOL processing step. In other embodiments, the concepts disclosed herein may be utilized at a FEOL process step. The techniques described herein may be utilized to provide a technique to etch structures having varying CDs across a substrate while minimizing RIE lag seen for narrow CD structures.

In one embodiment, the quasi-ALE process may involve a multi-step plasma process performed in a plasma chamber. More particularly, the quasi-ALE process may include a cyclic process in which repeated cycles of a deposition step, purge step and etch step are performed in a plasma process chamber. It will be recognized that a wide variety of process tools may be utilized for such quasi-ALE process. Merely as an example, the Vigus-LK3 and Vigus-TX process chambers available from Tokyo Electron Ltd. may be utilized. The first step may include a deposition process which deposits a polymer on exposed surfaces of the substrate being processed, such as for example including on the sidewalls of the mask layer 115. Thus the deposition process forms a polymer layer on the substrate. In one example, the gases provided during the plasma deposition may be C4F8 or C4F6, and argon. O2 may also be included. Next a purge step may occur to purge the plasma process chamber. In one embodiment, an inert gas such as argon is utilized for the purge step. After the purge step, an etch step may occur. In one embodiment, the etch step may be an argon plasma etch step, though it will be recognized that other etch chemistries may be utilized. In the exemplary process, the deposition and purge steps may occur at a relatively low RF power level, for example 100 watts while the etch step may occur at a higher RF power level, for example 200 watts so that the desired etch process may occur.

In one embodiment, the techniques disclosed herein may utilize the combination of a traditional bulk plasma etch, such as an extended CW etch process step which is not an ALE based process, in combination with the use of an ALE based process. In one example, an extended CW etch process may be utilized first, followed by the use of an ALE based process. In this embodiment, some portion of the layer to be etched (for example the dielectric layer 110 of FIG. 2) is first etched with a standard CW plasma etch for an extended period of time. Then, a second plasma etch may be performed using an ALE based process having deposition and etch sub-steps to finish the etch. The ALE based process conditions may as thus described above. In one exemplary embodiment, the standard CW plasma etch may have a C4F8/CF4/N2/Ar chemistry, 20 mT pressure, and 250 W high frequency RF power. In an alternate process, the ALE based process may first be performed followed by the standard extended CW plasma etch. When utilizing the combination of a non-ALE based etch process and an ALE based etch process, the desired final RIE lag may be obtained through the combination of the RIE lag of each process. More particularly, the final RIE lag may be adjusted by controlling the ALE based etch process to have an inverse RIE lag. For example, lowering the activation energy during the etching step of the quasi-ALE process or reducing the activation step time can contribute to leaving more polymer in the open areas while still enabling the etching in the dense areas. As known in the art, for an inverse RIE lag process etching increases in smaller geometry areas as compared to larger geometry areas. Thus, the final RIE lag of the combination of the non-ALE based etch process and the ALE based process may be less than would have been achieved if just the standard non-ALE based etch (for example an extended CW plasma etch) was utilized.

In one exemplary embodiment, two primary portions of an etch process may be provided, one portion being a non-ALE based plasma etch process and the second portion being an ALE based plasma process. The ALE based plasma process may, in one embodiment, include a cyclic process of deposition, purge and etch process steps. The non-ALE based plasma etch process may exhibit RIE lag and the ALE based plasma process may exhibit inverse RIE lag. In one embodiment, the non-ALE based plasma process may be performed first and the ALE based plasma process performed second. In one embodiment, the non-ALE based plasma etch and the ALE based plasma etch may be performed in the same process tool as different steps of one etch sequence. In one embodiment, all the processing may occur in a common plasma chamber. Thus, the total etch lag achieved may be the result of a combination of the ALE based plasma process and non-ALE based plasma process.

In one exemplary process, the layer to be etched (such as dielectric layer 110 of FIG. 2) may be an ultra-low k dielectric layer. The ultra-low k dielectric layer may have a thickness of around 95 nm as deposited. Densification of the ultra-low k dielectric layer may result in a layer of around 65 nm. The etching of the ultra-low k dielectric may occur such that approximately 75% of the total thickness of the layer is etched through a non-ALE based plasma process having an RIE lag and approximately 25% of the total layer is etched through an ALE based plasma process having an inverse RIE lag. The final achieved RIE lag may be about 5 nm or less. Alternative processes may be utilized that have 90% non-ALE based etching and 10% ALE based etching, 80% non-ALE based etching and 20% ALE based etching, 50% ALE based etching and 50% non-ALE based etching, 25% ALE based etching and 75% non-ALE based etching or even 10% ALE based etching and 90% non-ALE based etching. It will be recognized that the selection of any particular ratio of non-ALE to ALE based etching will varying based upon various factors specific to any given substrate processing flow including the thicknesses of the materials to be etched, process throughput requirements and RIE lag tolerances. In any event, the utilization of both a non-ALE based etch and an ALE based etch provides expanded opportunities to optimize the results obtained for any particular substrate process flow.

Figure 3:
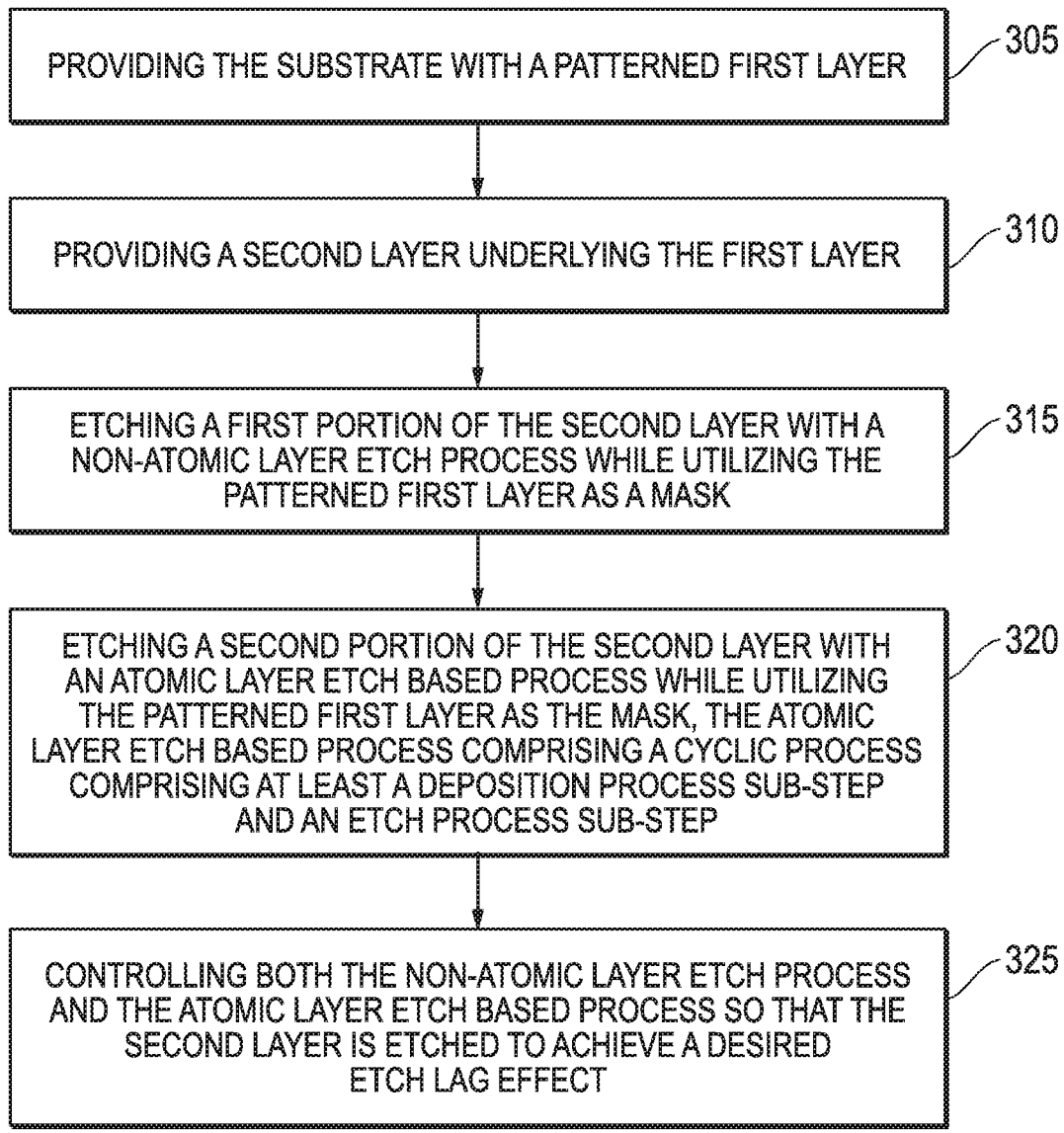
FIGS. 3-5 illustrate exemplary process flow charts for various embodiments of the substrate processing techniques disclosed herein.
Figure 4:
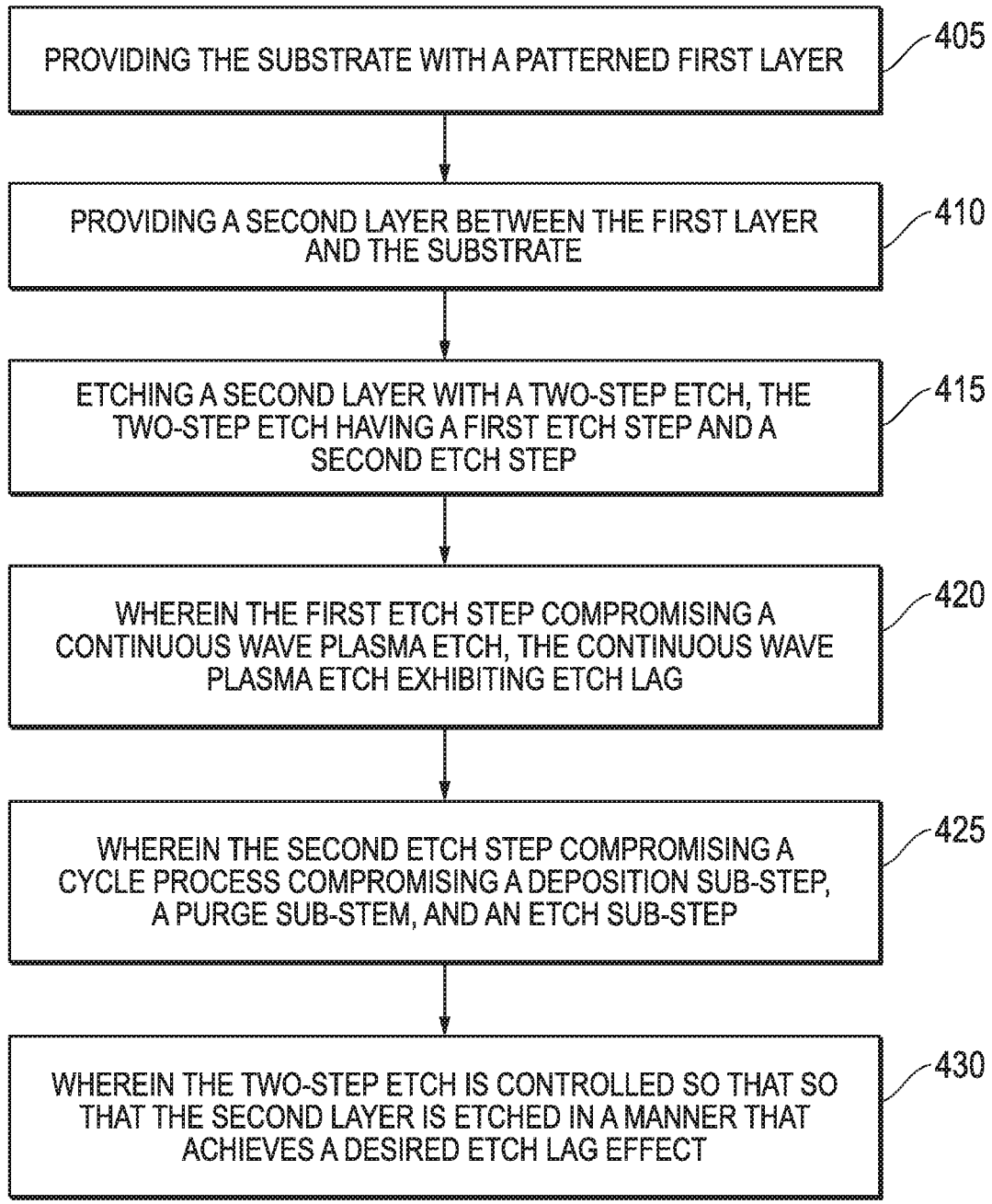
Figure 5:
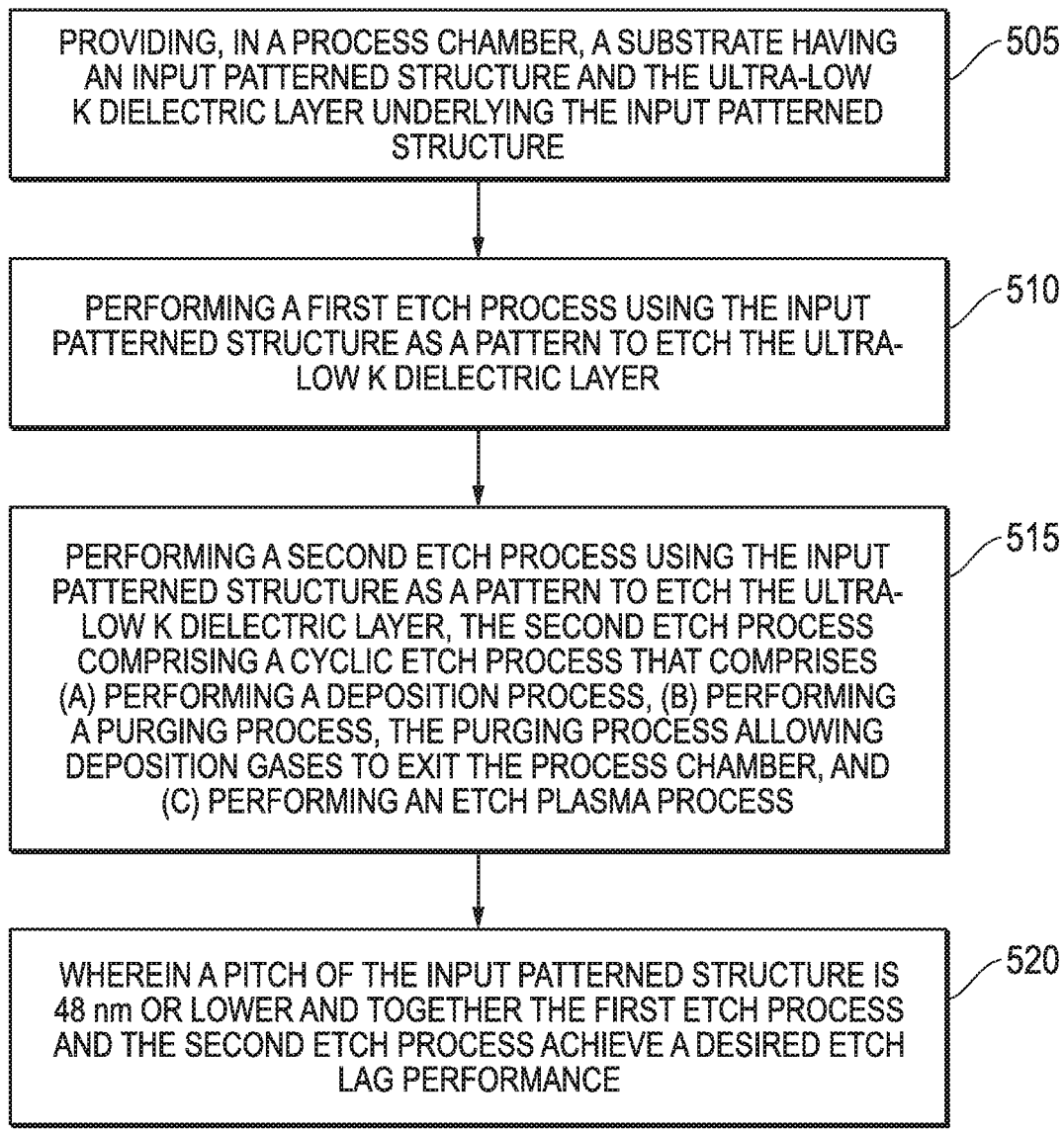

Exemplary process flows for utilizing the techniques described herein are provided in FIGS. 3-5. It will be recognized that these process flows are merely exemplary and the techniques described herein may be utilized in other manners. Further, it will be recognized that additional steps may be added to the exemplary process flows while still utilizing the advantageous benefits of the techniques disclosed herein. Additionally, it will be recognized by those skilled in the art that various steps of the process flows may be performed together or in combination or in a different order and thus, each step of the process flows is not limited to being a separate independent process step as shown.

FIG. 3 illustrates a method for processing a substrate. The method may include a step 305 of providing the substrate with a patterned first layer and step 310 of providing a second layer underling the first layer. The method further may include a step 315 of etching a first portion of the second layer with a non-atomic layer etch process while utilizing the patterned first layer as a mask. The method also includes a step 320 of etching a second portion of the second layer with an atomic layer etch based process while utilizing the patterned first layer as the mask, the atomic layer etch based process comprising a cyclic process comprising at least a deposition process sub-step and an etch process sub-step. The method further includes step 325 of controlling both the non-atomic layer etch process and the atomic layer etch based process so that the second layer is etched to achieve a desired etch lag effect.

FIG. 4 illustrates another method for processing a substrate. The method may include a step 405 of providing the substrate with a patterned first layer and step 410 of providing a second layer between the first layer and the substrate. The method may further include step 415 of etching the second layer with a two-step etch, the two-step etch having a first etch step and a second etch step. The method further includes step 420, wherein the first etch step comprising a continuous wave plasma etch, the continuous wave plasma etch exhibiting etch lag. The method further includes step 425 wherein the second etch step comprising a cyclic process comprising a deposition sub-step, a purge sub-step, and an etch sub-step. The method further includes step 430 wherein the two-step etch is controlled so that so that the second layer is etched in a manner that achieves a desired etch lag effect.

FIG. 5 illustrates a method for processing an ultra-low K dielectric layer in a reactive ion etch for processing a substrate. The method may include a step 505 of providing, in a process chamber, a substrate having an input patterned structure and the ultra-low k dielectric layer underlying the input patterned structure. The method may further include a step 510 of performing a first etch process using the input patterned structure as a pattern to etch the ultra-low k dielectric layer. The method may further include step 515 of performing a second etch process using the input patterned structure as a pattern to etch the ultra-low k dielectric layer. The second etch process comprises a cyclic etch process that comprises performing a deposition process, performing a purging process, the purging process allowing deposition gases to exit the process chamber, and performing an etch plasma process. The method may further include a step 520 wherein a pitch of the input patterned structure is 48 nm or lower and together the first etch process and the second etch process achieve a desired etch lag performance.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method for processing a substrate, comprising:
   providing the substrate with a patterned first layer;
   providing a second layer underling the first layer;
   etching a first portion of the second layer with a non-atomic layer etch process while utilizing the patterned first layer as a mask;
   after etching the first portion, etching a second portion of the second layer with an atomic layer etch based process while utilizing the patterned first layer as the mask, the atomic layer etch based process comprising a cyclic process comprising at least a deposition process sub-step and an etch process sub-step, and wherein during the deposition process sub-step a deposit is formed on a sidewall of the patterned first layer which alters an etch lag during the etch process sub-step; and
   controlling both the non-atomic layer etch process and the atomic layer etch based process so that the second layer is etched to achieve a desired etch lag effect.

2. The method of claim 1, the second layer being a low k dielectric layer.

3. The method of claim 2, the patterned first layer being a back end of line trench pattern.

4. The method of claim 2, the patterned first layer having structures with a pitch of 48 nm or less and the desired etch lag effect being etch lag of 5 nm or less.

5. The method of claim 1, the atomic layer etch based process comprising a deposition process sub-step, a purge sub-step and an etch process sub-step, the deposition process sub-step, the purge sub-step and the etch process sub-step being repeated a plurality of times.

6. The method of claim 5, the atomic layer etch based process being a quasi-atomic layer etch.

7. The method of claim 5, wherein the first portion of the second layer comprises a first thickness of the second layer that is at least 50% of a total thickness of the second layer such that at least 50% of the thickness of the second layer is etched with the non-atomic layer etch, and thereafter, the second portion of the second layer is etched with the atomic layer based etch.

8. The method according to claim 1, wherein the deposition process sub-step is performed with RF power at a first power level and the etch process sub-step is performed with RF power at a second power level, and wherein the second power level is higher than the first power level.

9. The method according to claim 7, wherein the deposition process sub-step is performed with RF power at a first power level and the etch process sub-step is performed with RE power at a second power level, and wherein the second power level is higher than the first power level.

10. The method according to claim 1, wherein the patterned first layer is formed of titanium nitride.

11. A method for processing a substrate, comprising:
    providing the substrate with a patterned first layer;
    providing a second layer underling the first layer;
    etching a first portion of the second layer with a non-atomic layer etch process while utilizing the patterned first layer as a mask;
    etching a second portion of the second layer with an atomic layer etch based process while utilizing the patterned first layer as the mask, the atomic layer etch based process comprising a cyclic process comprising at least a deposition process sub-step and an etch process sub-step; and
    controlling both the non-atomic layer etch process and the atomic layer etch based process so that the second layer is etched to achieve a desired etch lag effect,
    wherein the atomic layer etch based process comprising the deposition process sub-step, a purge sub-step and the etch process sub-step, the deposition process sub-step, the purge sub-step and the etch process sub-step being repeated a plurality of times, and
    the non-atomic layer etch process having etch lag and the atomic layer etch process having inverse etch lag.

12. The method of claim 11, a total etch lag of the non-atomic layer etch process having etch lag and the atomic layer etch process being 5 nm or less.

* * * * *